WAVEFORM GENERATOR EMPLOYING CASCADED TUNNEL DIODES

Filed Sept. 21, 1962

WITNESSES
Leon J. Laza
Dean Schron

INVENTORS
Vasil Uzunoglu and
Frederick E. Shirk
BY Ernest P. Klipfel
ATTORNEY

United States Patent Office 3,189,760

Patented June 15, 1965

3,189,760
WAVEFORM GENERATOR EMPLOYING CASCADED TUNNEL DIODES

Vasil Uzunoglu, Hanover, and Frederick E. Shirk, Baltimore, Md., assignors to Westinghouse Electric Corporation, East Pittsburgh, Pa., a corporation of Pennsylvania Filed Sept. 21, 1962, Ser. No. 225,352
7 Claims. (Cl. 307—88.5)

This invention relates in general, to waveform generators, and in particular to a staircase waveform generator utilizing high speed switching devices.

Staircase waveform generators are used, not only for providing a desired step voltage waveform, but may be utilized for frequency division purposes or in counting circuits. In order to obtain the staircase waveform many circuits have been devised which utilize a plurality of monostable multivibrator devices, the outputs of which are fed to a plurality of carefully chosen resistors in an adding network. Such circuits require precisely known resistances, in addition to requiring exacting impedance matching between the output circuits and the multivibrators to prevent interactions. Other types of staircase waveform generators use a plurality of diodes or the like, in conjunction with an energy storage device such as a capacitor, and wherein input pulses build up the charge on the capacitor, and the voltage across the capacitor is substantially a staircase voltage waveform. In many such circuits variations in the amplitude of the input pulse will cause undesirable variations in the output waveform.

It is therefore one object of the present invention to provide an improved staircase waveform generator which will neglect slight variations in input pulse amplitude.

It is another object to provide an improved staircase waveform generator which eliminates the need for storage capacitors.

A further object is to provide an improved waveform generator utilizing high speed semiconductor switching devices to obtain faster response time.

Briefly, in accordance with the objects, there is provided a plurality of high speed semiconductor switching devices each having a voltage-current characteristic curve which has two regions of positive resistance and one region of negative resistance between these positive resistance regions. The two positive resistance regions correspond to two stable states of operation, one in a high current or low voltage range and the other in a low current or high voltage range. Input means are provided for applying sequential input pulses to switch the semiconductor devices between stable states of operation to thereby vary the current through the semiconductor switching devices. Output means are provided in the current flow path of the semiconductor switching devices and will produce an output voltage waveform in accordance with the currents flowing therethrough. By choosing different operating points on the voltage current characteristic curves of the semiconductor devices a combination of currents may be chosen to flow through the output means to thereby produce a staircase waveform.

The above stated and further objects of the present invention will become apparent upon reading the following detailed specification taken in conjunction with the drawings, in which.

Figure 1:
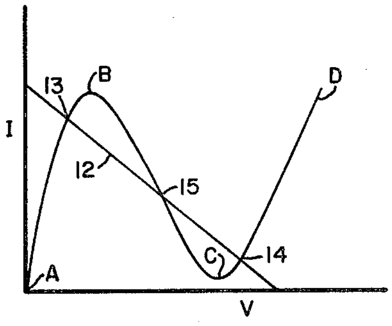
FIGURES 1 and 2 are typical characteristic curves of semiconductor devices which may be used in the present invention.

Referring now to FIG. 1, there is shown a typical characteristic curve of a tunnel diode, a semiconductor device which may be used in the present invention. It may be seen that the portions A to B and C to D exhibit the characteristics of a positive resistance, while the portion B to C exhibits the characteristic of a negative resistance. The use of the word tunnel diode herein is intended to include various types of switching devices which exhibit similar characteristics. A typical load line 12, drawn on the characteristic curve intersects the curve at three points 13, 15 and 14. Assuming that operation is at point 13, the high current state, an increase in voltage across the tunnel diode causes the load line 12 to move parallel to itself until peak current point B is reached, after which operation quickly jumps to the CD portion of the characteristic curve and after removal of the input pulse causing the shift to the CD portion, the operating point will be at 14, the low current state of operation. By causing the load line to move downward along the CD portion of the characteristic curve, after valley current point C is reached, operation will then switch back to the AB or high current state of operation. If the tunnel diode is in its high current-low voltage state of operation, it may be switched to its low current-high voltage state of operation by an application of a positive pulse of sufficient magnitude to its anode, or a negative pulse of sufficient magnitude to its cathode, both of which have the effect of moving the load line 12 parallel to itself upwardly along the characteristic curve. Conversely, operation may be switched from the low current to the high current state of operation by application of a negative pulse of sufficient magnitude to the anode, or a positive pulse of sufficient magnitude to the cathode, both of which have the effect of moving the load line 12 parallel to itself downwardly along the characteristic curve.

Figure 2:
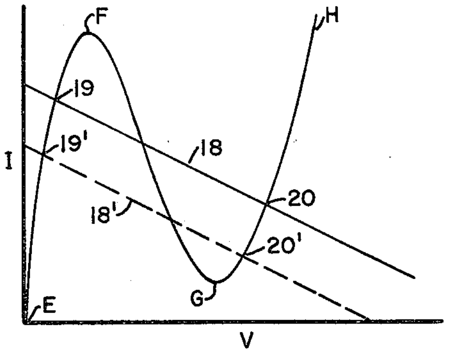

The various tunnel diodes utilized herein may have similar peak and valley current values with different load lines, however, better sensitivity and more uniformly spaced amplitudes may be obtained with tunnel diodes exhibiting different valued peak and valley currents in their characteristic curves. One such characteristic curve of another tunnel diode utilized in the present invention is shown in FIG. 2 and is similar to the characteristic curve shown in FIG. 1 in that the E to F portion exhibits a region of positive resistance and the F to G portion exhibits a region of negative resistance. A positive resistance region is again exhibited by the portion of the characteristic curve G to H. A typical load line 18 may intersect the characteristic curve at two stable states of operation, one at 19, the high current stable state of operation, and the other at 20, the low current stable state of operation. It may be seen that the peak current at F and the valley current at G have higher values than the respective peak and valley currents of the characteristic curve of FIG. 1.

Figure 3:
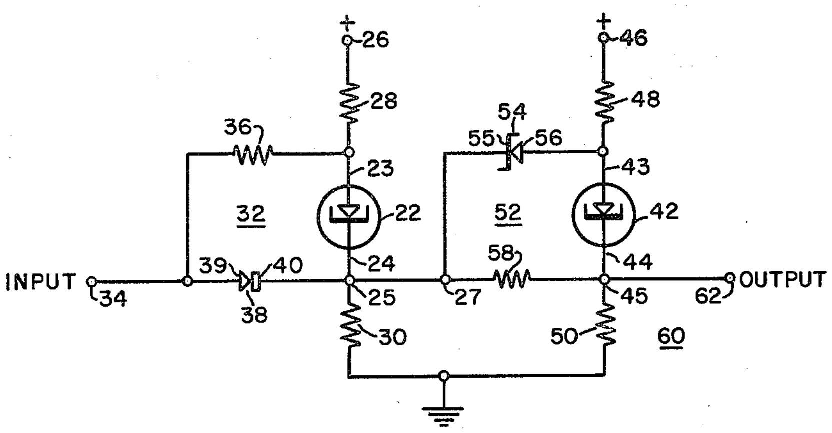
FIG. 3 shows one preferred embodiment of the present invention.

Referring now to FIG. 3, there is shown one embodiment of the present invention. Tunnel diode 22 is provided and exhibits the voltage-current characteristics of FIG. 1. Terminal 26 may be connected to a source of positive potential which, acting in conjunction with resistors 28 and 30, bias the tunnel diode 22 into a first state of operation which may, for example, be the low current-high voltage state of operation represented by point 14 of FIG. 1, the load line 12 being determined by the combination of resistances. Operation in the low current-high voltage range will hereinafter be referred to as the first state of operation, and operation in the high current-low voltage range will hereinafter be referred to as the second state of operation. In order to apply sequential input pulses to the tunnel diode 22 to switch states of operation thereof, there is provided an input circuit 32 which includes input terminal 34 connected to the anode 23 of the tunnel diode 22 through resistor 36. Input terminal 34 is also connected to the cathode 24 of tunnel diode 22 through diode 38. The portion of the circuit thus described acts as a bistable multivibrator and is further described and claimed in a copending application Serial No. 211,360, filed July 20, 1962, by Vasil Uzunoglu and assigned to the assignee of the present invention. A second tunnel diode 42 is provided which exhibits the voltage current characteristic of FIG. 2. Terminal 46 may be connected to a source of positive potential which acting in conjunction with resistors 48 and 50 bias the tunnel diode 42 into its first state of operation, represented by point 20 of FIG. 2, the load line 18 being determined by the combination of resistances. Input circuit 52 includes an associated diode 54 having an anode 56 connected to the anode 43 of tunnel diode 42, and resistance 58 having one terminal connected to the cathode 44 of tunnel diode 42. The other terminal of resistance 58 and the cathode 55 of diode 54 are connected at point 27. Output circuit 60 includes resistance 50 and means for obtaining the voltage thereacross which may take the form of output lead 62.

Figure 4:
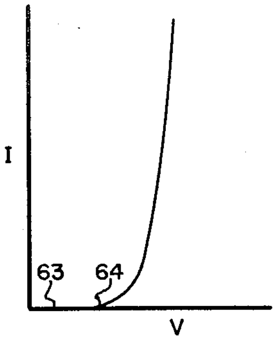
FIG. 4 is a characteristic curve of a typical silicon diode.

FIG. 4 shows a typical characteristic curve for a semiconductor diode such as a silicon diode. It may be seen that there is little or no conduction through the diode as the voltage across it is increased, until such point 64 is reached, after which, conduction occurs for relatively little increase in voltage. If a diode is biased to point 64, it will hereinafter be described as biased for conduction, whereas if biased to a point 63, for example, it will be described as biased for non-conduction.

Figure 5:
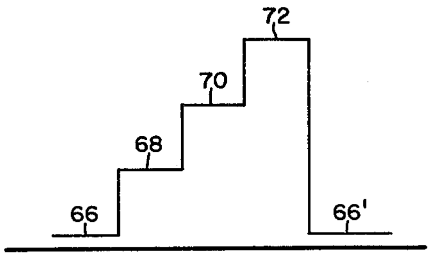
FIG. 5 shows the output waveform obtained from the circuit of FIG. 3.

FIG. 5 shows in idealized form the output voltage waveform obtained at output lead 62. The first step or plateau 66 represents a condition wherein both of the tunnel diodes 22 and 42 are in their first state of operation. Plateau 68 is caused by the current flowing through resistor 50 when tunnel diode 22 is in its second, and tunnel diode 42 is in its first state of operation. Plateau 70 represents the condition wherein the tunnel diode 22 is in its first, and tunnel diode 42 is in its second state of operation, and plateau 72 represents a condition wherein both tunnel diodes are in their second state of operation.

In operation, assume that tunnel diodes 22 and 42 of FIG. 3 are both in their first state of operation as represented by points 14 and 20, respectively, of FIGS. 1 and 2. The resistance 50 not only is in the current flow path of tunnel diode 42, but some of the current flowing through tunnel diode 22 will also flow through resistance 50 via resistance 58 and then to ground. Therefore, the output voltage thereacross will be the result of a summation of currents resulting from tunnel diodes 22 and 42. It may be seen that the voltage across the tunnel diode 22 is applied to diode 38 to bias it, and with the tunnel diode 22 in its first state of operation, the diode 38 will be biased for conduction as represented for example by point 64 of FIG. 4. When a positive input pulse is applied to input terminal 34 it will appear at the anode 23 of tunnel diode 22 and tend to shift the operating point 14 upwardly along the CD portion of the characteristic curve of FIG. 1. However, this same input pulse is also applied to the diode 38, and since diode 38 is biased for conduction it will pass the pulse through to the cathode 24 of tunnel diode 22 after a short time delay due to propagation time and inherent capacitance in the diode 38. The positive pulse appearing at the cathode 24 will switch the tunnel diode 22 to its second state of operation as represented by point 13 on the curve on FIG. 1. The switching of tunnel diode 22 from its first state of operation to its second state of operation has the effect of increasing the voltage at point 25, and consequently increasing the voltage at points 27 and 45. The increasing voltage appearing at point 27 is applied to the cathode 55 of the diode 54 but will not cause conduction thereof. The increasing voltage at point 45 which is applied to the cathode 44 of tunnel diode 42 will tend to switch it to its second state of operation. The parameters of the circuit may be chosen, however, so that this latter positive pulse appearing at the cathode 44 will shift the load line 18 to a new position along the GH portion of the characteristic curve of FIG. 2, which new position is represented by the load line 18' with the operating point being 20' still in the first state of operation. The combination of currents flowing through resistor 50 then will be due to the high value current flowing through tunnel diode 22 and the low value current flowing through tunnel diode 42 which currents will cause a voltage drop across resistor 50 to produce the voltage step 68 as shown in FIG. 5. Assume now that a second positive pulse is applied to the input terminal 34. Since the tunnel diode 22 is in its second state of operation the diode 38 is biased for non-conduction and will not pass this positive pulse through. The pulse is, however, applied through resistance 36 to the anode 23 of the tunnel diode 22 to cause it to switch back to its first state of operation. In so doing the voltage appearing at points 25, 27 and 45 will decrease. Since tunnel diode 42 is in its first state of operation, diode 54 is biased for conduction and a decreasing voltage applied to the cathode 55 will cause conduction thereof. In order to obtain a fast response time with relatively little delay the diode 54 may take the form of a Zener diode. When diode 54 conducts, a decreasing voltage is applied to the anode 43 of the tunnel diode 42 thereby further shifting the load line downwardly to switch the tunnel diode 42 to its second state of operation, and the current flowing through resistor 50 will produce an output voltage as represented by plateau 70 of the output waveform of FIG. 5. Since diode 38 is being biased for conduction by tunnel diode 22 in its first state of operation, a subsequent positive input pulse will cause tunnel diode 22 to switch back to its second state of operation as was previously explained which action has the effect of increasing the voltage at points 25, 27 and 45. An increasing voltage at point 27 will not cause conduction of diode 54. An increasing voltage at point 45 which is applied to the cathode 44 of tunnel diode 42 has the effect of keeping the tunnel diode 42 in its second state of operation with a new current operating point such as point 19' for example. The combination of currents flowing through resistor 50 due to both tunnel diodes 22 and 42 being in their second state of operation produces an output voltage as represented by plateau 72 of the output waveform of FIG. 5. Since both tunnel diodes 22 and 42 are in their second state of operation, the diodes 38 and 54 will be biased for non-conduction, and a subsequent positive input pulse applied to input terminal 34 will cause the tunnel diode 22 to assume its first state of operation as was previously explained, which has the effect of decreasing the voltage at points 25, 27 and 45. Since diode 54 is biased for non-conduction the decrease in voltage applied to its cathode 55 will not cause conduction thereof whereas the decreasing voltage appearing at point 45 and applied to the cathode 44 of tunnel diode 42 has the effect of switching tunnel diode 42 to its first state of operation, the combination of low currents passing through resistance 50 again producing a plateau as represented by 66' in the output waveform of FIG. 5. The aforedescribed cycle of operation will continue upon the occurrence of subsequent positive input pulses at the input terminal 34. It may be seen that positive input pulses of proper polarity and amplitude will cause the switching of the tunnel diodes in the circuit in a predetermined manner. Slight variations in the amplitude of the input pulse however will not affect the magnitude of the output waveform since this is determined by the currents flowing through the tunnel diodes and the input pulses are merely necessary to cause a switching of the states of operation of the tunnel diodes.

Accordingly, a waveform generator has been provided utilizing two tunnel diodes each having two stable states of operation. By increasing the number of tunnel diode stages to thereby increase the number of combinations of stable states available, a staircase generator may be formed to provide an output waveform having an increased number of steps with each step having a magnitude determined by the characteristics of the tunnel diode utilized and the operating points as determined by the load lines.

Although the present invention has been described with a certain degree of particularity, it should be understood that the present disclosure has been made by way of example and that numerous changes in the details and construction and the combination and arrangement of parts may be resorted to without departing from the scope and spirit of the invention.

What is claimed is:

1. A function generator comprising in combination: a plurality of switching devices each operable in a high current and a low current stable state of operation; each of said switching devices having a high current operating point and a low current operating point different from the others of said plurality; means for placing each said switching device into one of said states of operation; input means for receiving sequential input pulses of like polarity to alternately switch states of operation of a first of said switching devices; a successive switching device of said plurality of switching devices operatively connected to said first of said switching devices to switch states of operation in a predetermined sequence in response to the switching of states of said first switching device; and output means responsive to the current flowing through said plurality of switching devices to provide a step output signal, with each step of said signal determined by the states of operation of said plurality of switching devices.

2. A staircase wave generator comprising in combination: at least a first and second semiconductor switching device, each operable in a high and low current stable state of operation, the high and low current operating points of said second switching device being different than those of said first switching device; means for placing said first and second switching devices into one of their stable states of operation; input means for applying like polarity sequential pulses to said first switching device to alternately change its state of operation; said second switching device connected to said first switching device to sense the changing of states thereof to thereby change states of operation in a predetermined manner; output means including resistance means operably connected in the current flow paths of said switching devices, the combination of currents through said resistance means, due to the changing of states of operation of said switching devices producing different voltage drops across said resistance means.

3. A waveform generator comprising in combination: at least first and second switching devices each having a high and low current stable state of operation, means for placing said first and second switching device into one of their stable states of operation; means responsive to input pulses of like polarity to switch states of operation of said switching devices in a predetermined manner; and output means including resistance means operatively connected in the current flow paths of said switching devices and responsive to the current flow through said first and second switching devices to provide a pre-selected waveform as the switching devices switch between stable states thus providing a combination of high and low value currents through said resistance means.

4. A staircase waveform generator comprising in combination: at least a first and second tunnel diode; said second tunnel diode having a characteristic curve with a higher peak current than that of said first tunnel diode; said first and second tunnel diodes operable in a high current and a low current stable state of operation; means for placing each tunnel diode into one of its stable states of operation such that the high current operating point and the low current operating point of said second tunnel diode have greater values than the respective high and low current operating points of said first tunnel diode; input means for alternately switching states of operation of said first tunnel diode such that the current flowing therethrough alternately has a high value and a low value; said second tunnel diode connected to said first tunnel diode and responsive to the changing of states thereof to thereby change states of operation in a predetermined sequence such that the current flowing therethrough has a predetermined sequence of high or low values; and output means including resistance means in the current flow paths of said first and second tunnel diodes, the combination of different valued high and low currents flowing through said resistance means producing a substantially staircase waveform at said output means.

5. A waveform generator comprising in combination: at least a first and second tunnel diode; said second tunnel diode having a characteristic curve with a higher peak current than that of said first tunnel diode; said first and second tunnel diodes operable in a high current and a low current stable state of operation; means for placing each tunnel diode into one of its stable states of operation such that the high current operating point and the low current operating point of said second tunnel diode have greater values than the respective high and low current operating points of said first tunnel diode; input means including diode means, for receiving like polarity input pulses; said diode means being alternately biased for conduction and non-conduction in response to the states of operation of said first tunnel diode; said input pulses alternately switching states of operation of said first tunnel diode such that the current flowing therethrough alternately has a low value and a high value; said second tunnel diode having an input circuit including an associated diode; said associated diode being biased for conduction and non-conduction in response to the states of operation of said second tunnel diode; means for placing each said tunnel diode into their first state of operation; said input circuit operable thereafter to cause said second tunnel diode to switch states of operation in response to the alternate switching of states of operation of said first tunnel diode, such that the current flowing through said second tunnel diode has a predetermined sequence of low and high values; and output means including resistance means in the current flow paths of said first and second tunnel diodes, the combination of different valued high and low currents flowing through said resistance means producing a desired waveform at said output means.

6. A staircase wave generator comprising in combination: at least a first and second tunnel diode, each operable in a low and high current stable state of operation, the low and high current operating points of said second tunnel diode being different than those of said first tunnel diode; means for placing said first and second tunnel diodes into their low current stable states of operation; input means including diode means for receiving positive input pulses; said diode means being alternately biased for conduction and non-conduction in response to the states of operation of said first tunnel diode; said input pulses alternately switching states of operation of said first tunnel diode such that the current flowing therethrough alternately has a low value and a high value; said second tunnel diode having an input circuit including an associated diode; said associated diode being biased for conduction and non-conduction in response to the states of operation of said second tunnel diode; said input circuit for said second tunnel diode operable to cause said second tunnel diode to switch states of operation in response to the alternate switching of states of operation of said first tunnel diode such that said second tunnel diode switches states of operation on every other input pulse; and output means including resistance means operably connected in the current flow paths of said switching devices, the combination of currents through said resistance means, due to the changing of states of operation of said switching devices producing different voltage drops across said resistance means.

7. A function generator comprising in combination: at least two tunnel diodes, each having an anode and a cathode and a first and second state of operation; input means for said first tunnel diode including diode means, said diode means being biased for conduction in response to one state of operation of said first tunnel diode and biased for non-conduction in response to the other state of operation of said first tunnel diode; said first tunnel diode switching to said first state of operation in response to an input signal when said diode means is biased for non-conduction and switching to said second state of operation in response to an input signal when said diode means is biased for conduction; a following tunnel diode having an input circuit including an associated diode, said associated diode being biased for conduction in response to one state of operation of said following tunnel diode and being biased for non-conduction in response to the other state of operation of said following tunnel diode; said input circuit responsive to the second state of operation of said first tunnel diode for applying an increasing voltage to the cathode of said following tunnel diode to decrease the voltage and current magnitude of the first state of operation of said following tunnel diode when it is in its first state of operation and to decrease the voltage and current magnitude of the second state of operation of said following tunnel diode when it is in its second state of operation; said input cicuit additionally responsive to the first state of operation of said first tunnel diode for applying a decreasing voltage to the anode of said following tunnel diode when said associated diode is biased for conduction to switch the following tunnel diode to its second state of operation, and for applying a decreasing voltage to the cathode of said following tunnel diode when said associated diode is biased for non-conduction to switch the following tunnel diode to its first state of operation; and output means responsive to the current through said first tunnel diode and said following tunnel diode for providing an output voltage.

References Cited by the Examiner

UNITED STATES PATENTS

| | | | |
|---|---|---|---|
| 3,094,630 | 6/63 | Rapp et al. | 307—88.5 |
| 3,103,600 | 9/63 | Lewin | 307—88.5 |

OTHER REFERENCES

"GE Tunnel Diode Manual" by General Electric Co., March 20, 1961. Pages 47–48 and Fig. 5.6.

ARTHUR GAUSS, *Primary Examiner.*